US006262448B1

(12) United States Patent
Enders et al.

(10) Patent No.: US 6,262,448 B1
(45) Date of Patent: Jul. 17, 2001

(54) MEMORY CELL HAVING TRENCH CAPACITOR AND VERTICAL, DUAL-GATED TRANSISTOR

(75) Inventors: Gerhard Enders, Glen Allen; Matthias Ilg, Richmond, both of VA (US); Lothar Risch, Neubiberg; Dietrich Widmann, Unterhaching, both of (DE)

(73) Assignee: Infineon Technologies North America Corp., San Jose, CA (US)

( * ) Notice: Subject to any disclaimer, the term of this patent is extended or adjusted under 35 U.S.C. 154(b) by 0 days.

(21) Appl. No.: 09/302,756

(22) Filed: Apr. 30, 1999

(51) Int. Cl.[7] .................. H01L 27/108; H01L 29/76; H01L 29/94; H01L 31/119
(52) U.S. Cl. .................. 257/302; 257/301; 257/296
(58) Field of Search ............................. 257/302, 301, 257/304, 305, 296, 300

(56) References Cited

U.S. PATENT DOCUMENTS 5,032,882 * 7/1991 Okumura et al. .................. 357/23.6
5,216,266 * 6/1993 Ozake ............................... 257/302
5,821,579 * 10/1998 Choi et al. ......................... 257/302

OTHER PUBLICATIONS

"Silicon Processing for the VLSI Era, vol. 2: Process Integration" by Stanley Wolf, Ph.D., Lattice Press, California.

* cited by examiner

Primary Examiner—Steven Loke
Assistant Examiner—Douglas W. Owens

(57) ABSTRACT

A DRAM cell is disposed in an electrically isolated region of a semiconductor body. The cell includes a storage capacitor disposed in a trench. The capacitor is disposed entirely within the isolated region of the semiconductor body. The cell includes a transistor disposed in the isolated region. The transistor has a pair of gates. A word line is provided for addressing the cell. The word line has an electrical contact region to the transistor. The word line contact region is disposed entirely within the isolated region of the semiconductor body. The transistor has an active area. The active area has source, drain, and channel regions. The active area is disposed entirely within the isolated region of the semiconductor body. A bit line is provided for the cell. The bit line is in electrical contact with the gates of the transistor at a pair of bit line contact regions. Both such bit line contact regions are disposed entirely within the isolated region of the cell. With such an arrangement a DRAM cell is provided having a relatively occupies a relatively small amount of surface area of the semiconductor body.

6 Claims, 14 Drawing Sheets

US 6,262,448 B1

MEMORY CELL HAVING TRENCH CAPACITOR AND VERTICAL, DUAL-GATED TRANSISTOR

BACKGROUND OF THE INVENTION

This invention relates to semiconductor structures and more particularly to dynamic random access memory structures.

As is known in the art, for the commercial success of future generations of semiconductor memories, it will be essential to minimize die sizes and at the same time increase performance characteristics. One type of semiconductor memory is a dynamic random access memory (DRAM). In one such DRAM, an array of memory cells is provided. Each one of the memory cells incudes a transistor coupled to a storage capacitor. In a deep trench DRAM cell, the capacitor is formed in a deep trench which passes vertically into the surface of the semiconductor thereby reducing size as compare to a stack capacitor cell. Still, as noted above, for commercial success cell sizes must continue to be reduced.

SUMMARY OF THE INVENTION

In accordance with the present invention, a DRAM cell is disposed in an electrically isolated region of a semiconductor body. The cell includes a storage capacitor disposed in a trench. The capacitor is disposed entirely within the isolated region of the semiconductor body. The cell includes a transistor disposed in the isolated region. The transistor has a pair of gates. A word line is provided for addressing the cell. The word line has an electrical contact region to the transistor. The word line contact region is disposed entirely within the isolated region of the semiconductor body.

With such an arrangement a DRAM cell is provided which occupies a relatively small amount of surface area of the semiconductor body.

In accordance with another embodiment invention, the transistor has an active area. The active area has source, drain, and channel regions. The active area is disposed entirely within the isolated region of the semiconductor body.

In accordance with another invention, a bit line is provided for the cell. The bit line is in electrical contact with the gates of the transistor at a pair of bit line contact regions. Both such bit line contact regions are disposed entirely within the isolated region of the cell.

BRIEF DESCRIPTION OF THE DRAWINGS

Other features of the invention, as well as the invention itself, will become more readily from the following detailed description when read together with the accompanying drawings, in which.

DESCRIPTION OF THE PREFERRED EMBODIMENTS

Figure 1:
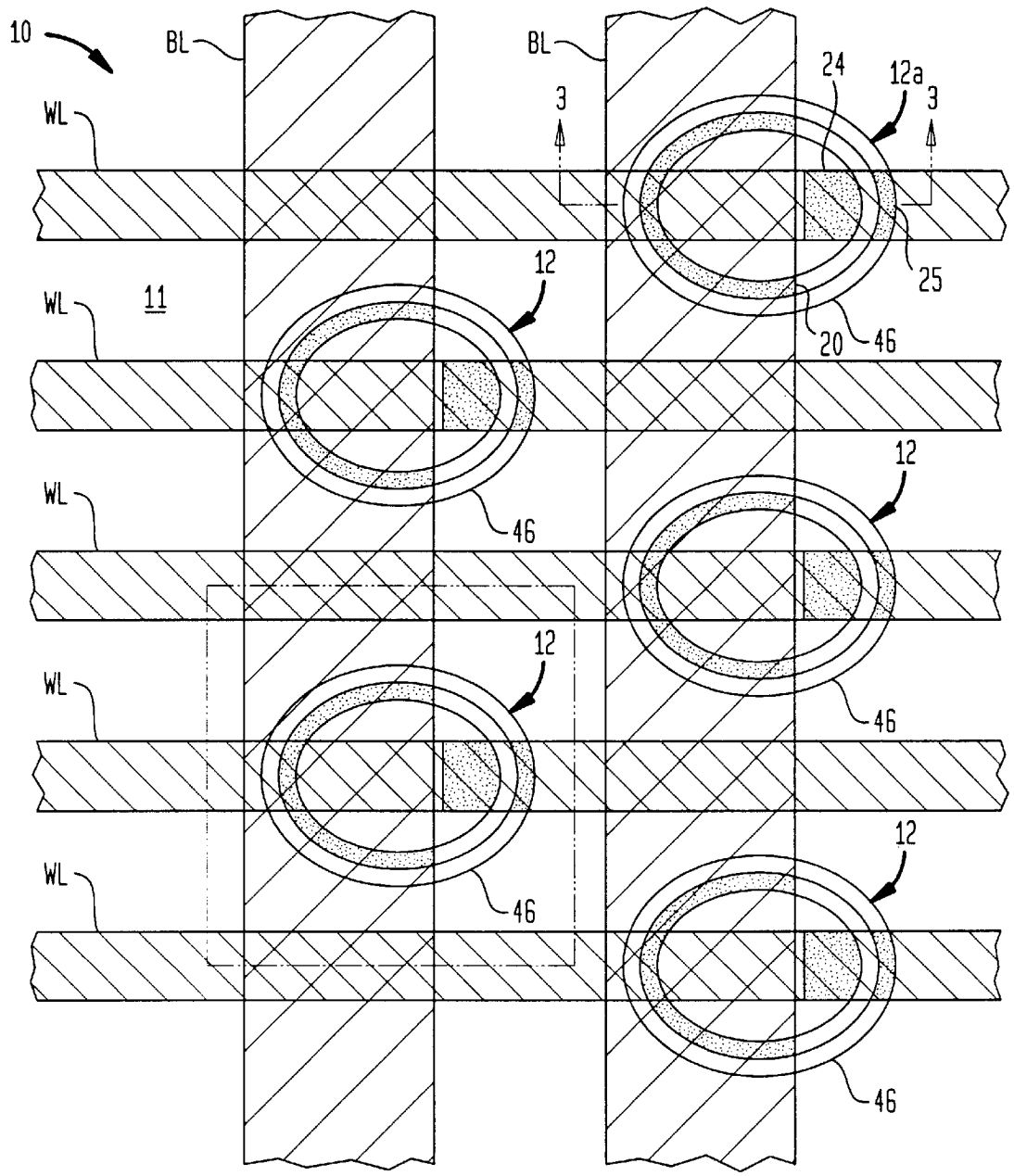
FIG. 1 is a plan view of an array of DRAM cells according to the invention.
Figure 2:
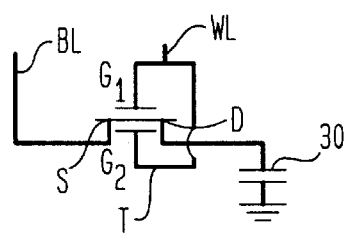
FIG. 2 is a schematic drawing of an exemplary one of the DRAM cells of FIG. 1.

Referring now to FIG. 1, an array 10 of DRAM cells 12 is shown formed in a semiconductor, here silicon substrate 11. The cells 12 are arranged in an array of rows and columns, as shown. Each one of the rows of cells 12 is connected to a corresponding one of a plurality of rows of word lines, WL, and each one of the columns of cells is connected to a corresponding one of a plurality of columns of bit lines, BL, as shown. Each one of the cells 12 is identical in construction, an exemplary one thereof being shown schematically in FIG. 2 to include a storage capacitor CAP coupled to a transistor T formed in a cylindrical-shaped region beneath the surface of the substrate 11. Here, the transistor T is a MOSFET device having its source region S connected to one of the bit lines, BL, and its gates $G_1$ and $G_2$ connected to one of the word lines WL. The drain region D of the transistor T is connected to one plate, or electrode, or the capacitor CAP and the other electrode of the capacitor CAP is connected to ground, here the substrate 11.

Figure 3:
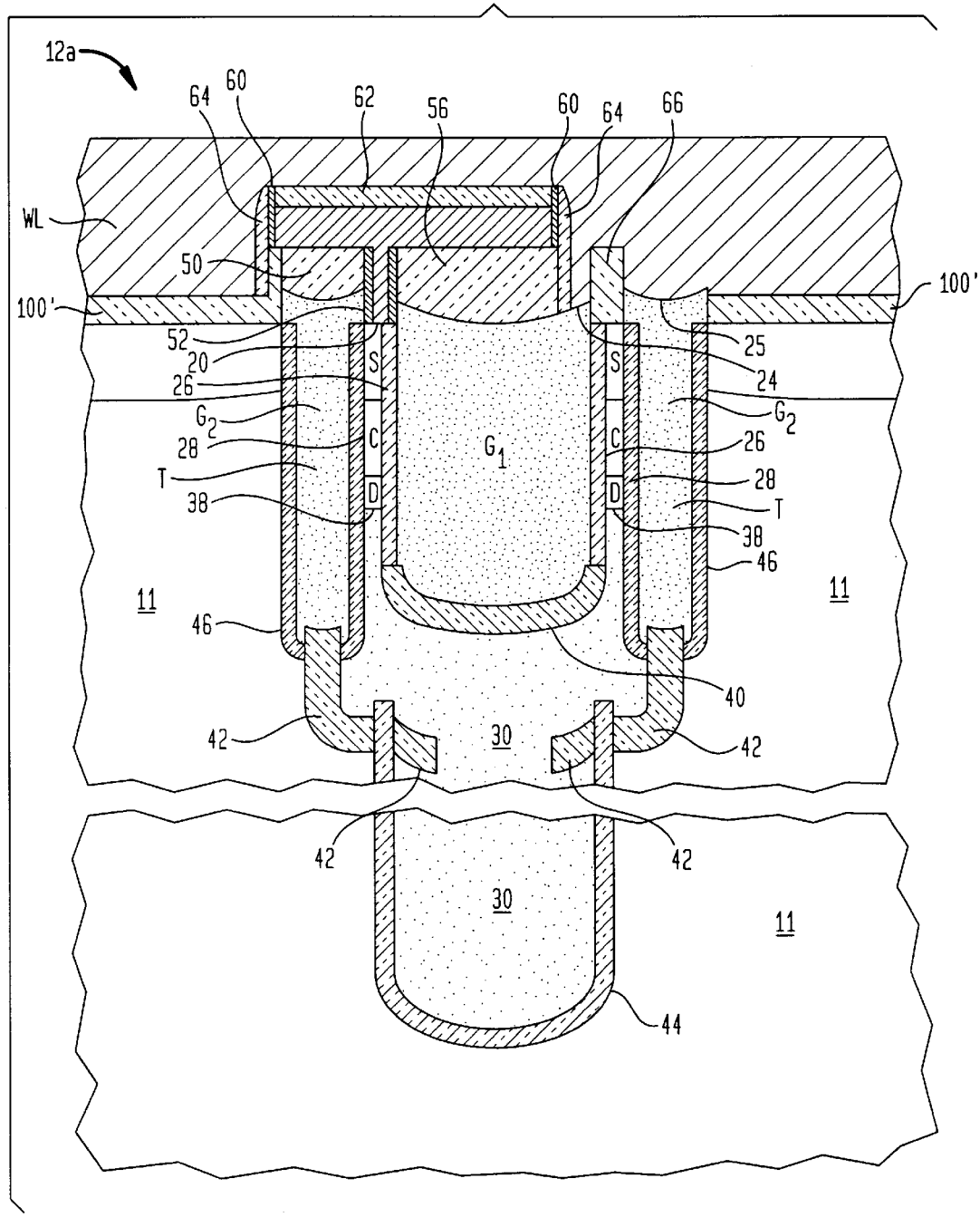
FIG. 3 is a cross-sectional, diagrammatical sketch of the exemplary one of the DRAM cells of FIG. 1, such cross section being taken along line 3—3 of FIG. 1.

Referring now to FIG. 3, a cross-sectional sketch of an exemplary one of the cells 12, here cell 12a, is shown. The transistor T includes a cylindrical-shaped source region, S, disposed in the substrate 11 and electrically connected to the bit line BL at a source contact region 20. Disposed in the substrate 11 beneath the cylindrical-shaped source region, S, is a cylindrical-shaped gate channel region, C, of the transistor T. Disposed beneath in the substrate 11 is a cylindrical-shaped drain region, D. The source region, S, drain region, D, and channel region C, as disposed in the active area of the silicon substrate 11. The word line WL is electrically connected to a pair of gate electrodes, $G_1$, $G_2$, of the transistor T at contact regions 24, 25, respectively. The gate electrodes, $G_1$ and $G_2$ are disposed in the substrate 11, as shown. The gate $G_1$ is disposed in the central region of the cell 12a and the gate $G_2$ is cylindrical-shaped and disposed about the central gate $G_1$. Here, the gate electrodes, $G_1$ and $G_2$, are doped polycrystalline silicon. A thermally grown, cylindrical-shaped gate silicon dioxide layer 26 is disposed between the gate electrode $G_1$ and one side of the gate channel C, and a cylindrical-shaped, thermally grown silicon dioxide layer 28 is disposed between the gate electrode $G_2$ and the opposite side of the gate channel region C to thereby provide the MOS FET device T with a dual, or double-gate transistor arrangement with carrier flow through the channel region C being controlled by the gates $G_1$ and $G_2$ on opposite sides of such gate channel region C for the cell 12a, shown schematically in FIG. 2.

The capacitor CAP of cell 12a is buried in a deep trench formed in the substrate 11, in a manner to be described. Suffice it to say here, that the capacitor CAP includes one electrode, i.e., a storage node 30, here doped polycrystalline silicon, which is electrically connected to the cylindrical-shaped drain region D of the transistor T at contact region 38. It is noted that the gate electrode, $G_1$ is electrically isolated from the storage node 30 by: a dielectric layer 42, here a thermally grown silicon dioxide layer; and, lower portions of the thermally grown, silicon dioxide, gate oxide layer 26. It is noted that the thickness of the silicon dioxide layer may be accurately controlled by the thermal growth process. The gate electrode $G_2$ is electrically isolated from such storage node 30 by: lower portions of the silicon dioxide layer 28; and a dielectric layer 40, here thermally grown silicon dioxide. The n type conductivity doped silicon substrate 11, which here forms the second electrode of the capacitor CAP, is electrically isolated from the bottom portion of the storage node 30 by a node dielectric layer 44, here silicon oxynitride; and, the silicon dioxide layer 42, as shown.

Further, the bit line BL, which, as noted above is electrically connected to the drain region, D, at contact region 20, is electrically isolated from gate $G_2$ by dielectric 50, here deposited silicon dioxide, and dielectric layer 52, here also deposited silicon dioxide. The bit line BL is electrically isolated from the gate $G_1$ by dielectric 56, here deposited silicon dioxide. The word line WL is electrically isolated from the bit line BL by dielectric layers 60, 62, and 64, here deposited silicon dioxide, silicon nitride and silicon dioxide, respectively. It is also noted that a dielectric stub 66, here silicon nitride, electrically isolates gate $G_1$ from gate $G_2$. The word line WL is electrically isolated from the substrate 11 by a dielectric layer 100', here a lower thin layer of thermally grown silicon dioxide and a thicker upper layer of deposited silicon nitride.

It should be noted that a dielectric layer 46, here thermally grown silicon dioxide, provides the outer periphery of the trench DRAM cell 12a, as shown also in FIGS. 1 and 3. That is, the dielectric layer 46 provides the outer periphery of the cell 12a. To put it another way, the cell 12a is disposed in a region of the semiconductor substrate 11 having as its outer periphery, the dielectric layer 46.

It is also noted that the transistor T is a double-gate transistor and that the bit line BL contact 20 is, referring also to FIG. 1, disposed over a region entirely within the outer periphery provided layer 46 (i.e., above a region within the outer periphery of the cell 12a). Further, the active area of the transistor T (i.e., the region having the source, drain, and channel regions, S, D, and C, respectively), is entirely within the outer periphery of the cell 12a. Still further, it is noted, referring also to FIG. 1, that the word line WL is also above a region entirely within the outer periphery of the cell 12a.

Figure 4A:
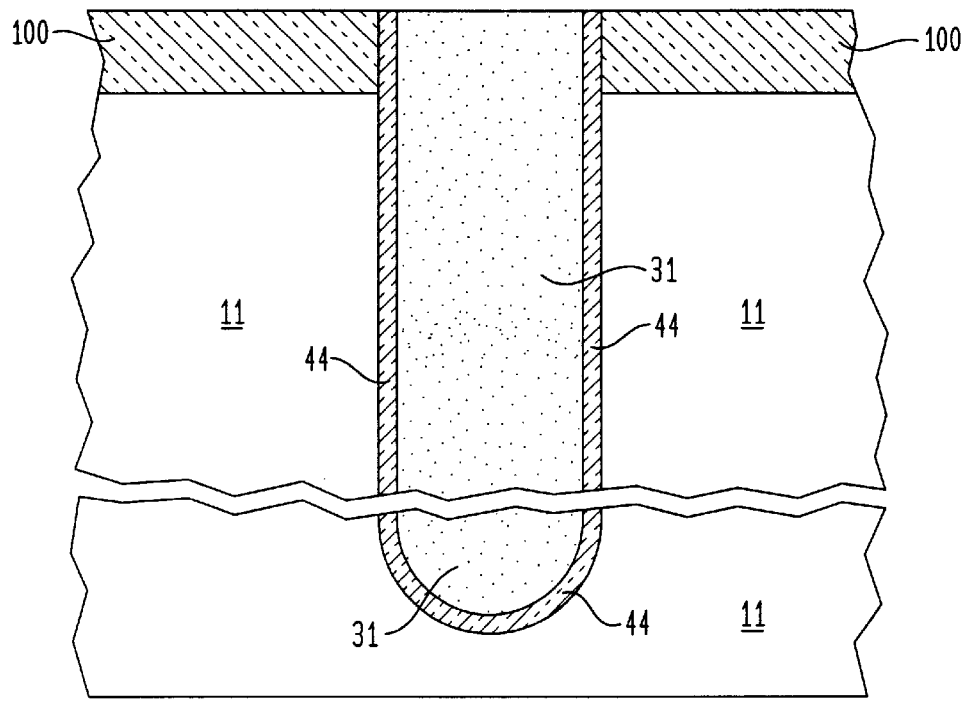
FIGS. 4A–4W are cross-sectional, diagrammatical sketches of the exemplary one of the DRAM cells of FIG. 3 at various stages in the fabrication thereof.
Figure 4B:
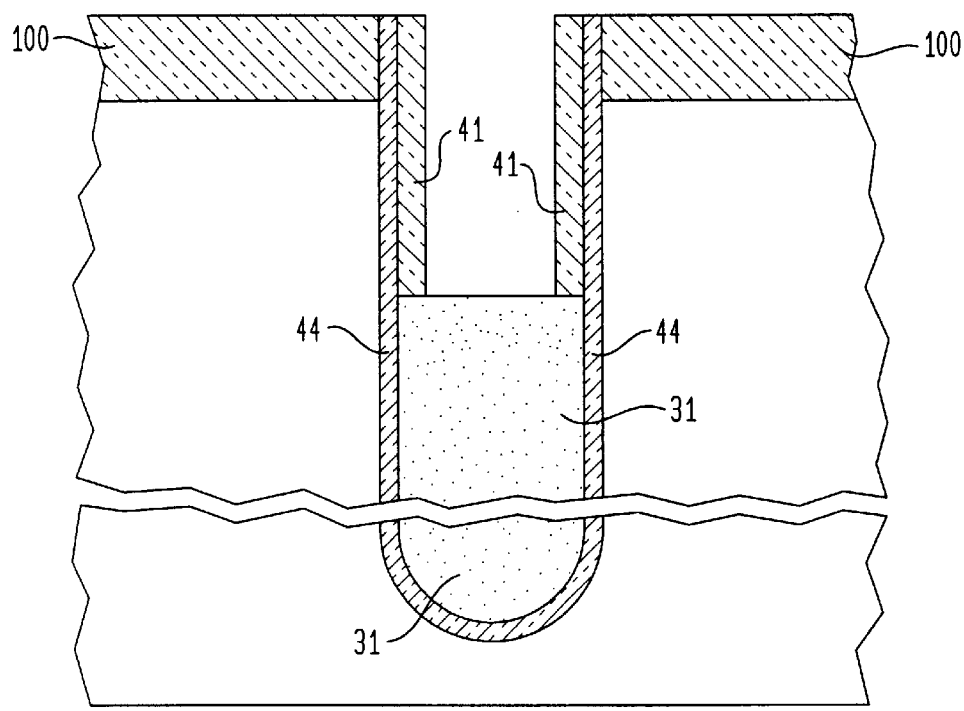
Figure 4C:
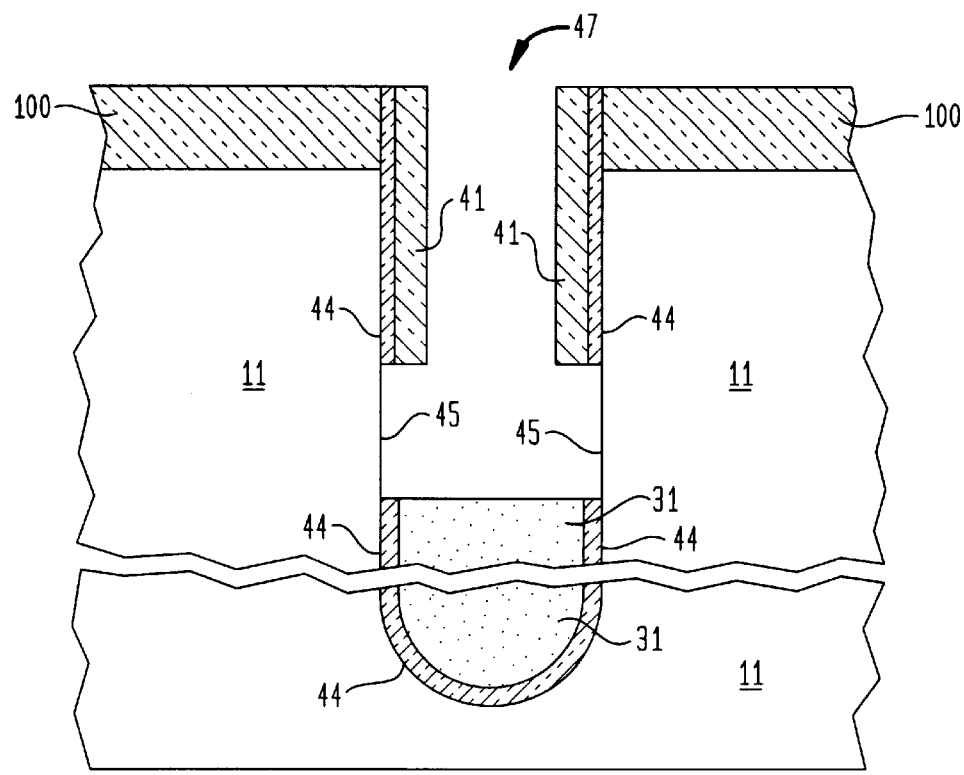
Figure 4D:
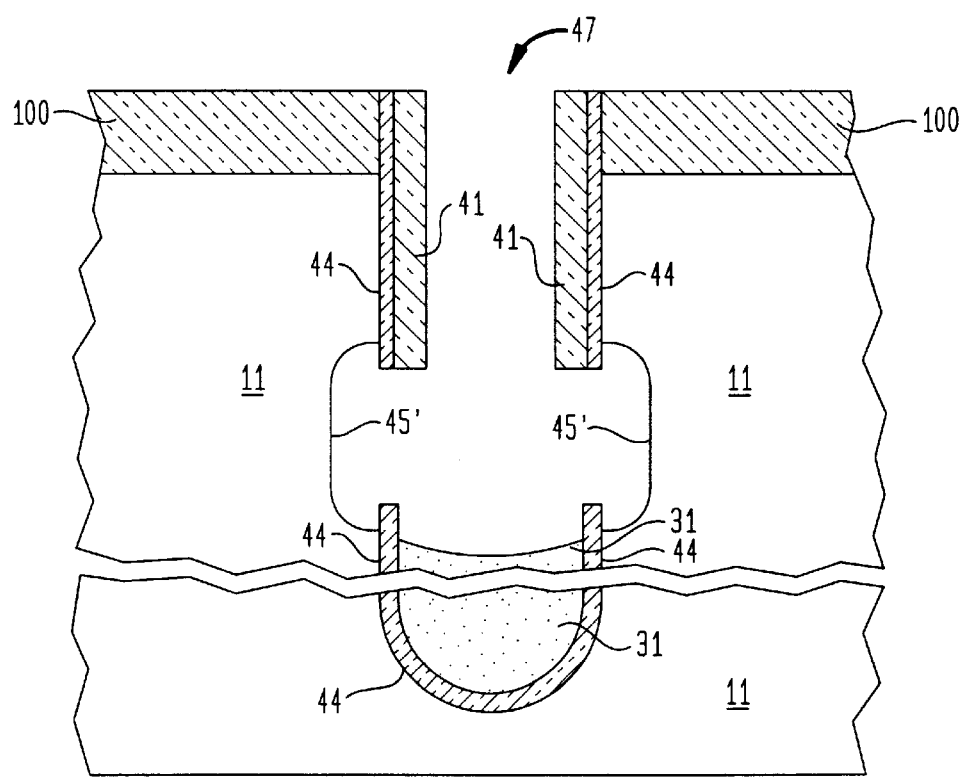
Figure 4E:
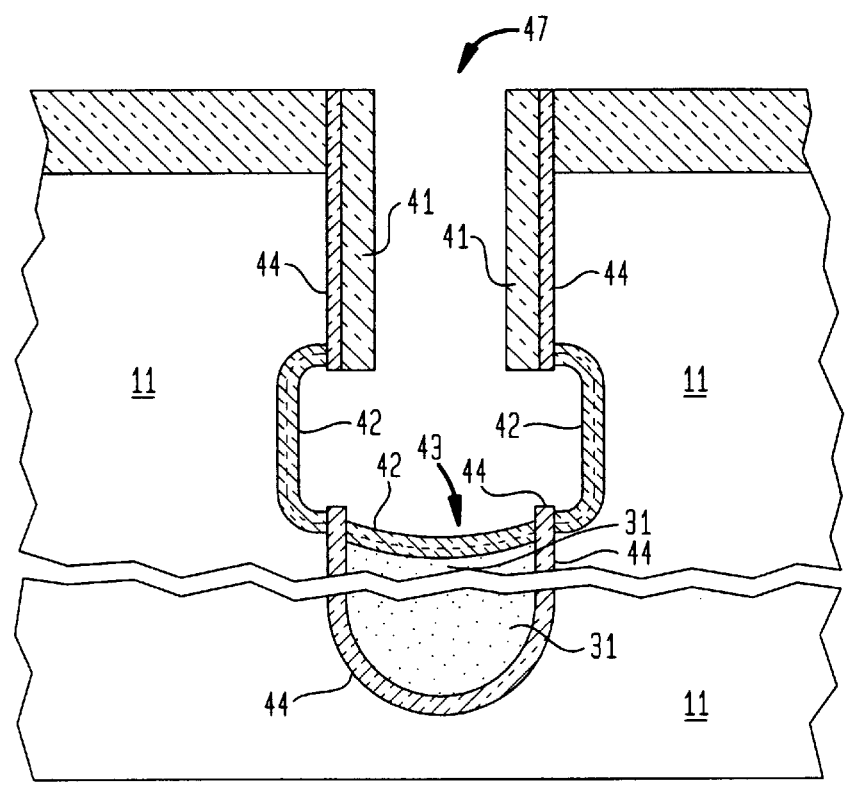
Figure 4F:
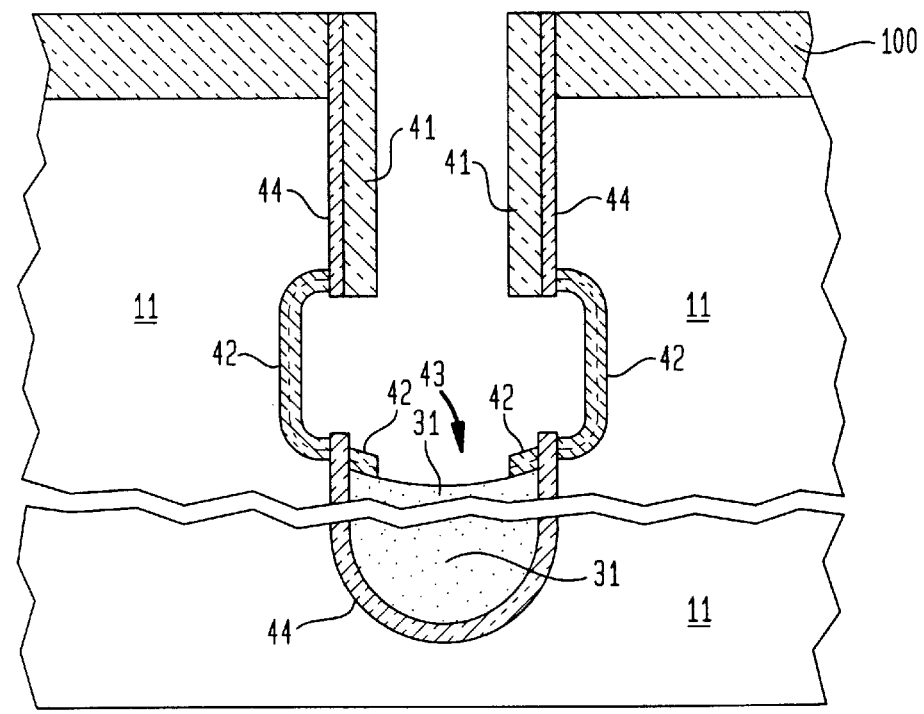
Figure 4G:
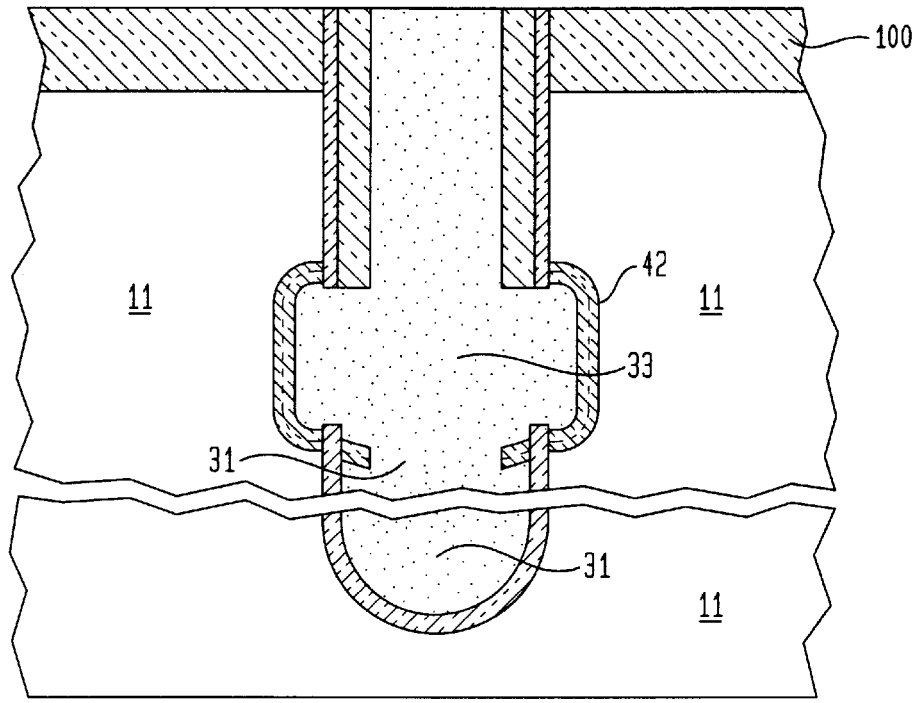
Figure 4H:
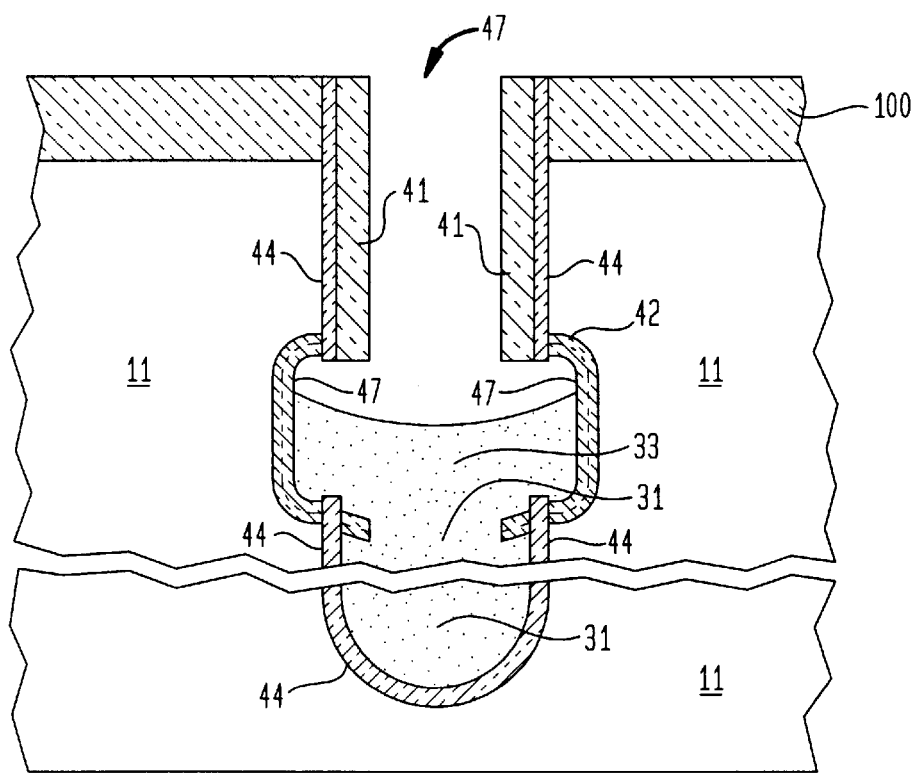
Figure 4I:
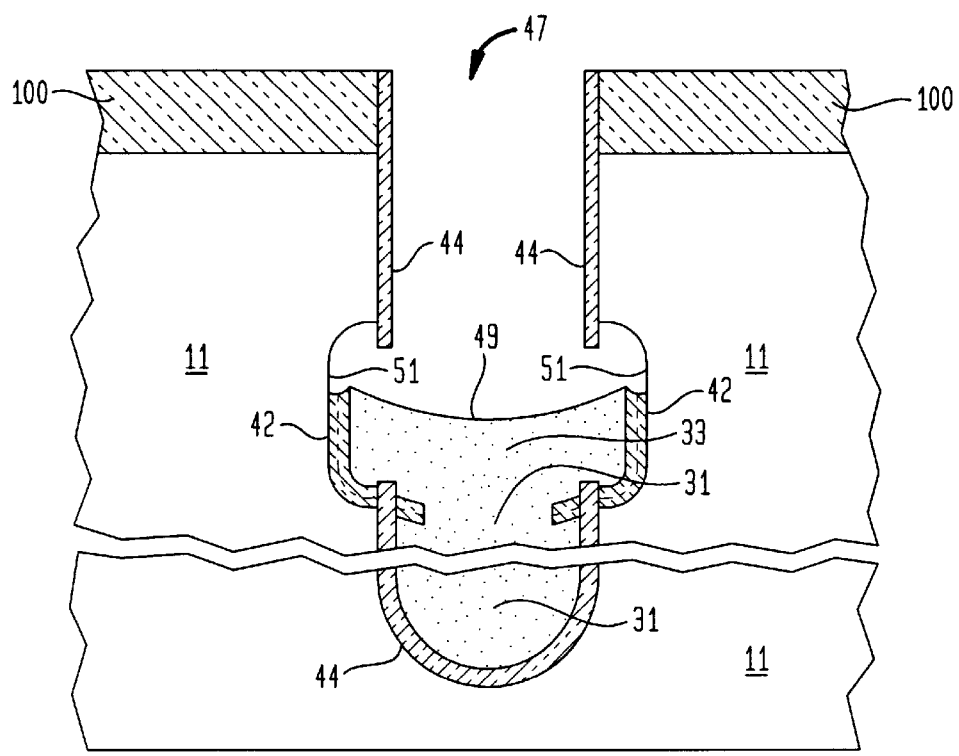
Figure 4J:
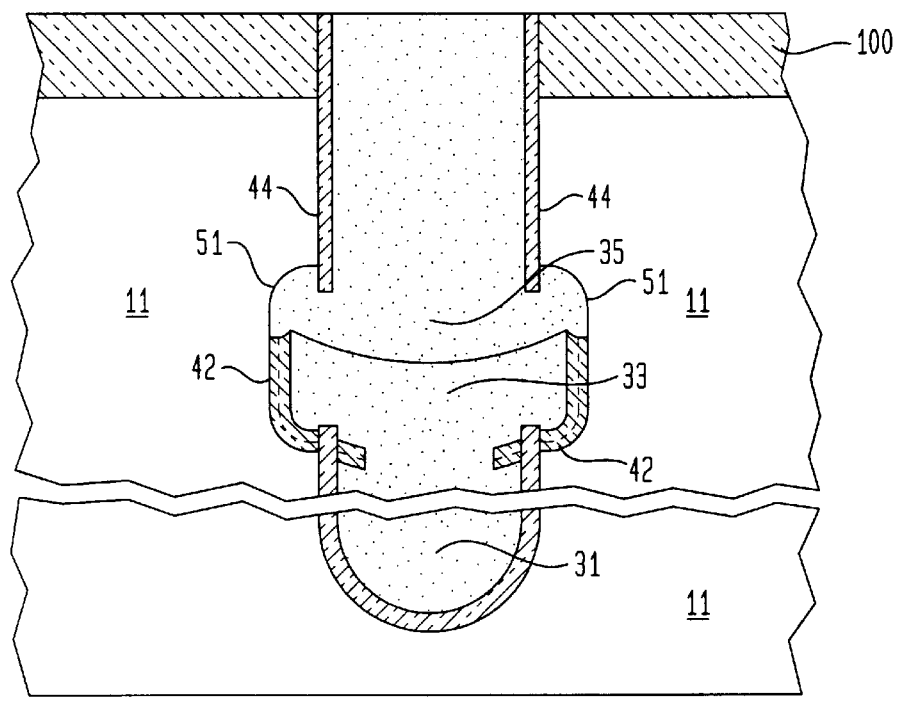
Figure 4K:
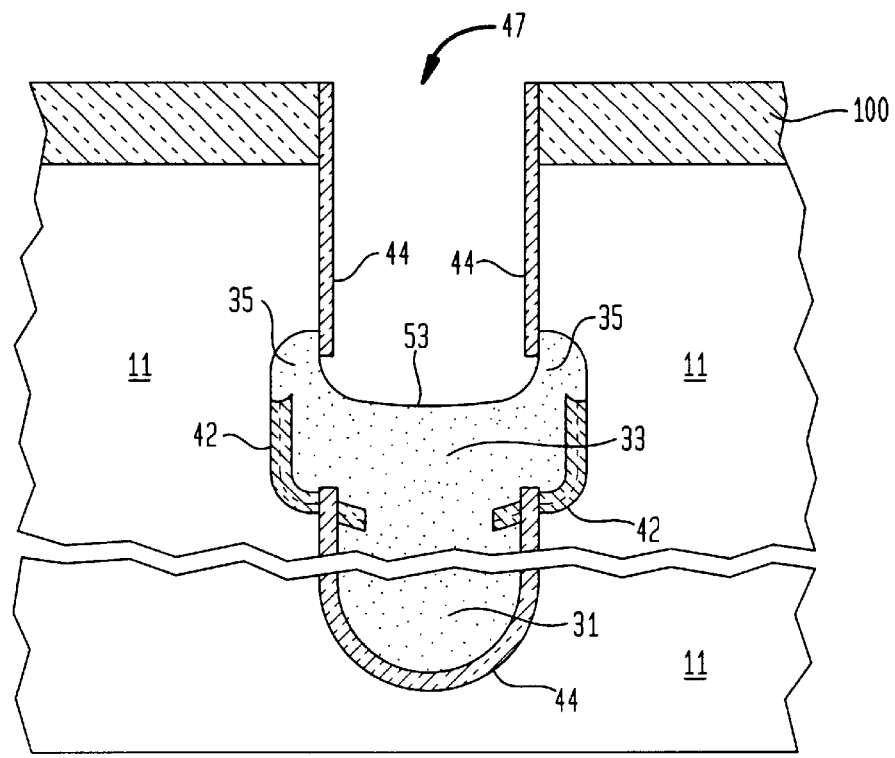
Figure 4L:
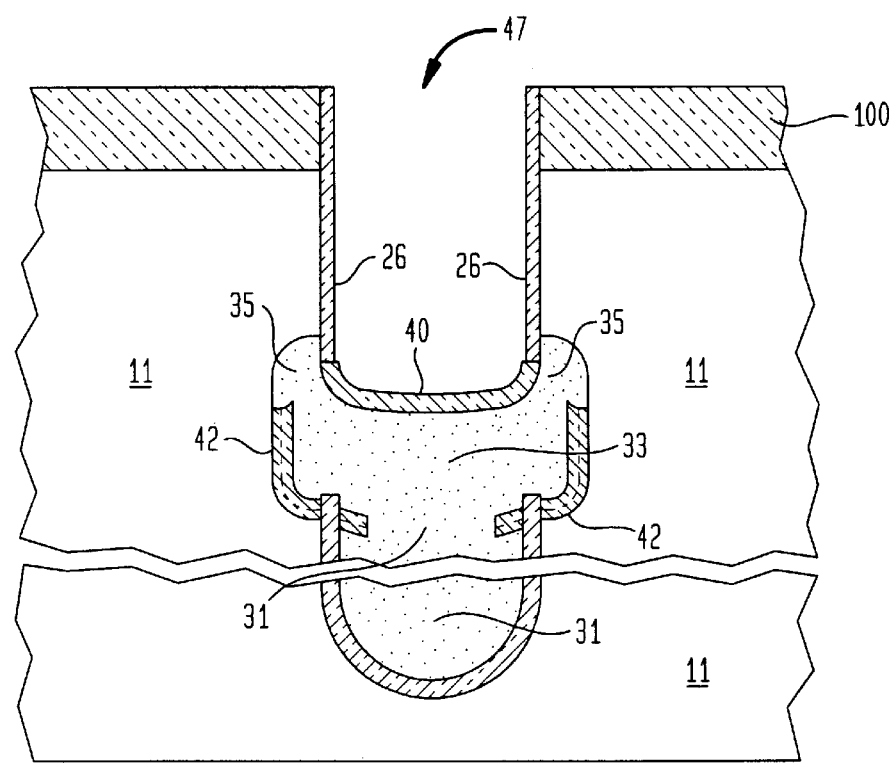
Figure 4M:
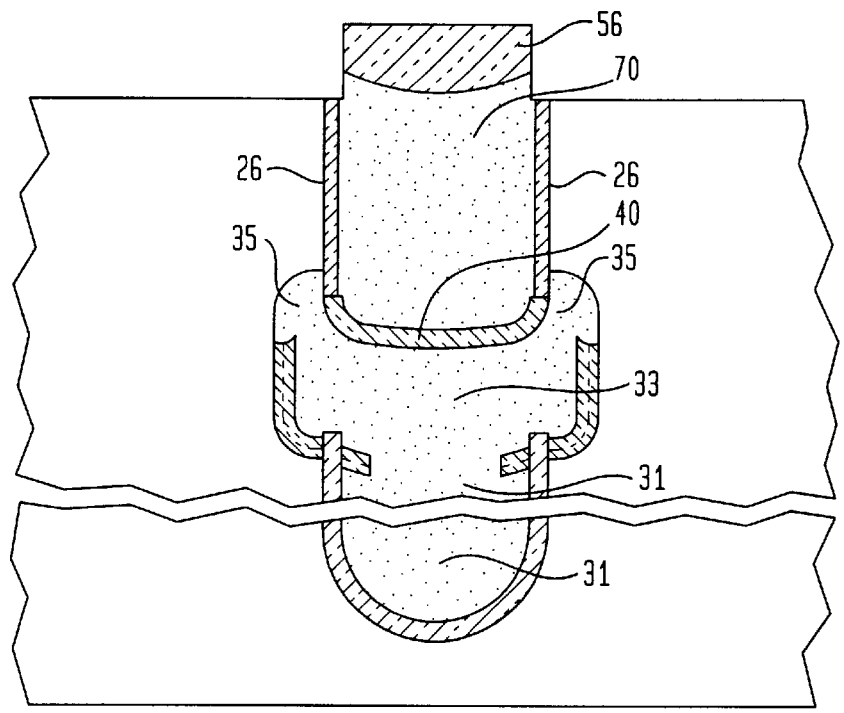
Figure 4N:
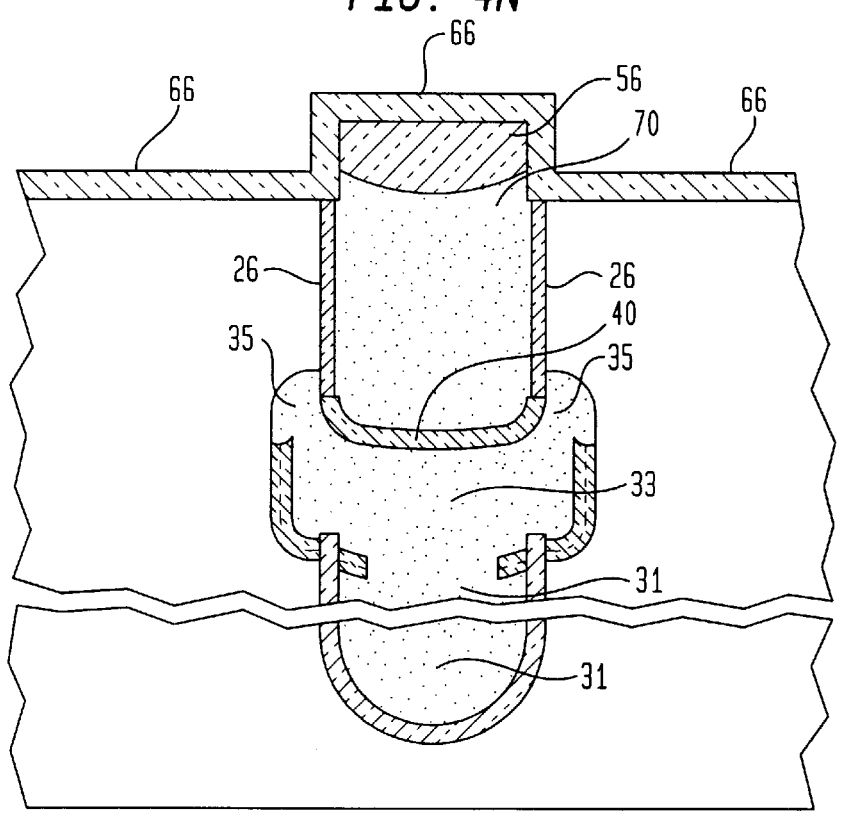
Figure 4O:
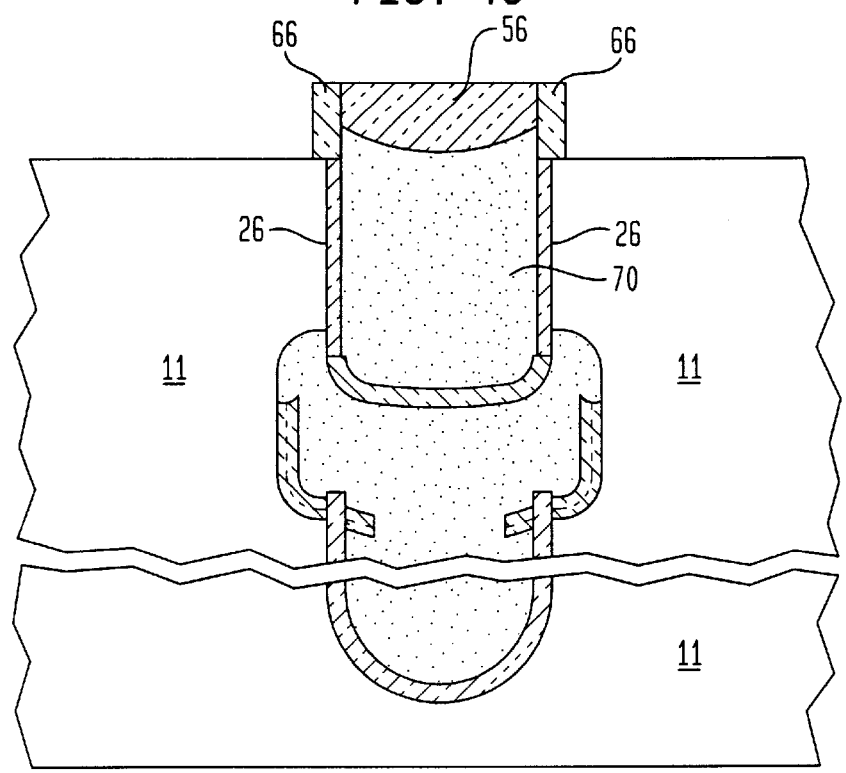
Figure 4P:
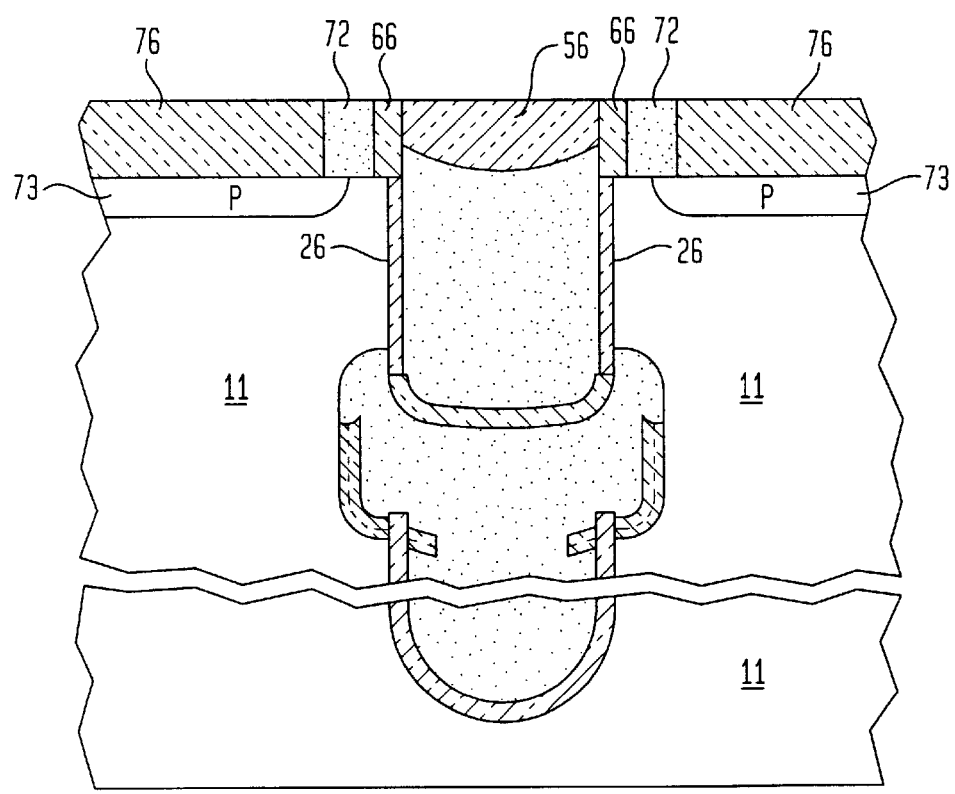
Figure 4Q:
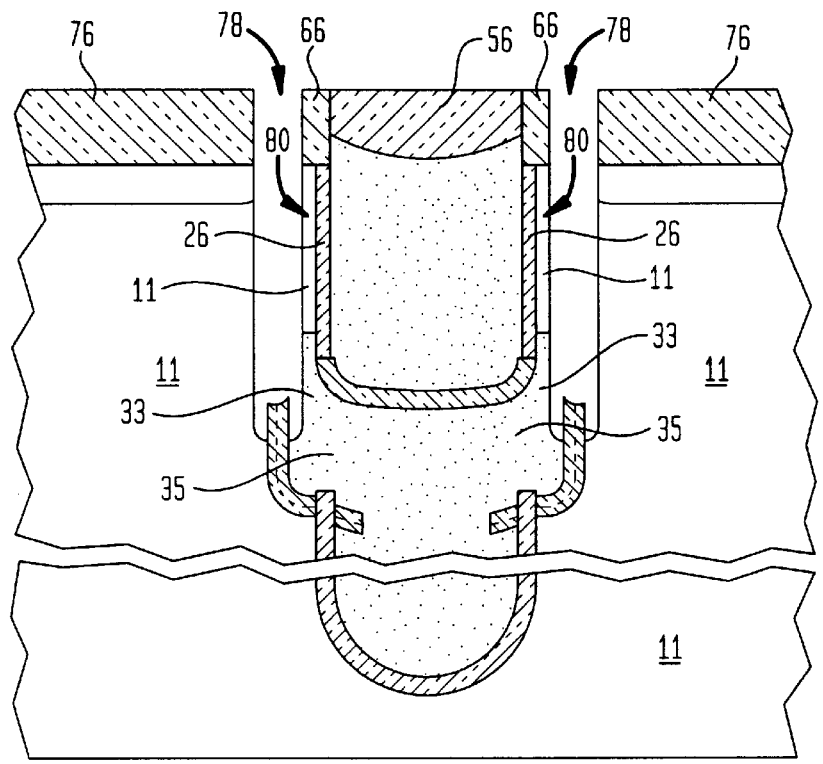
Figure 4R:
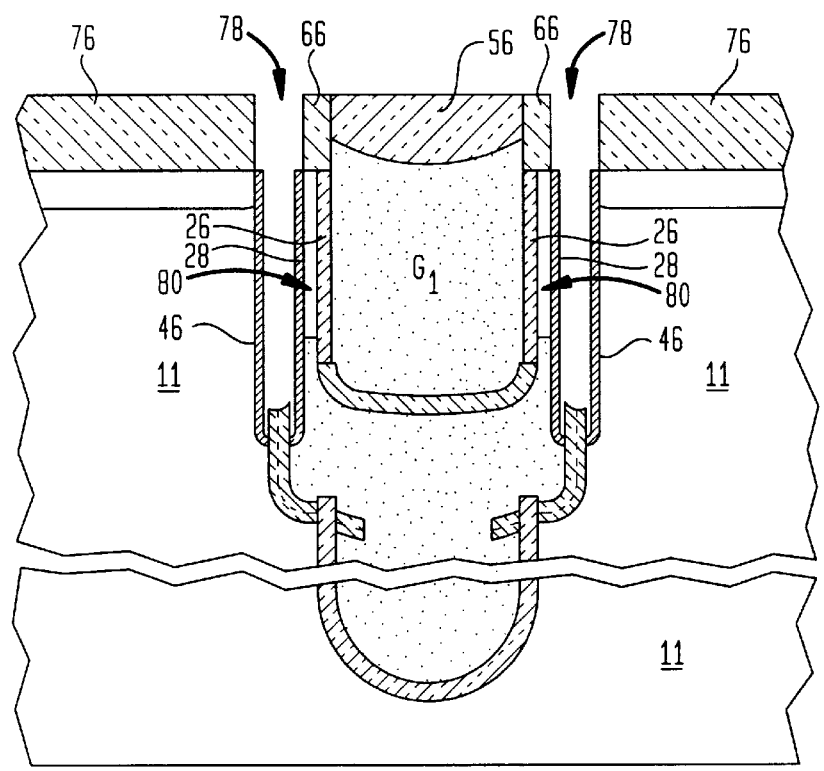
Figure 4S:
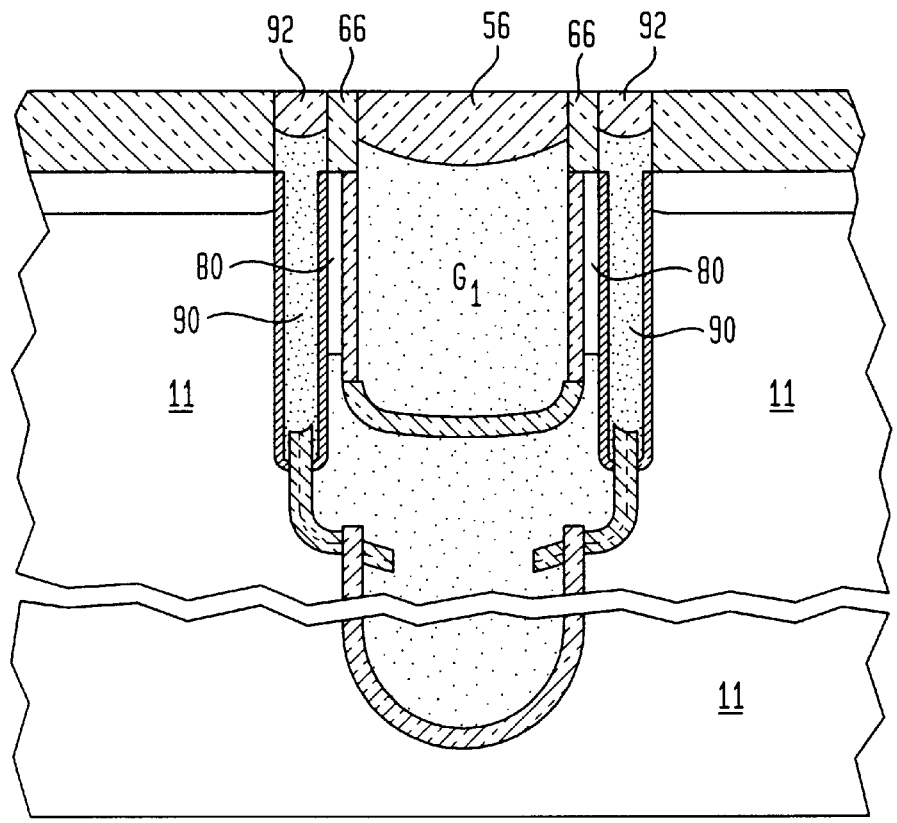
Figure 4T:
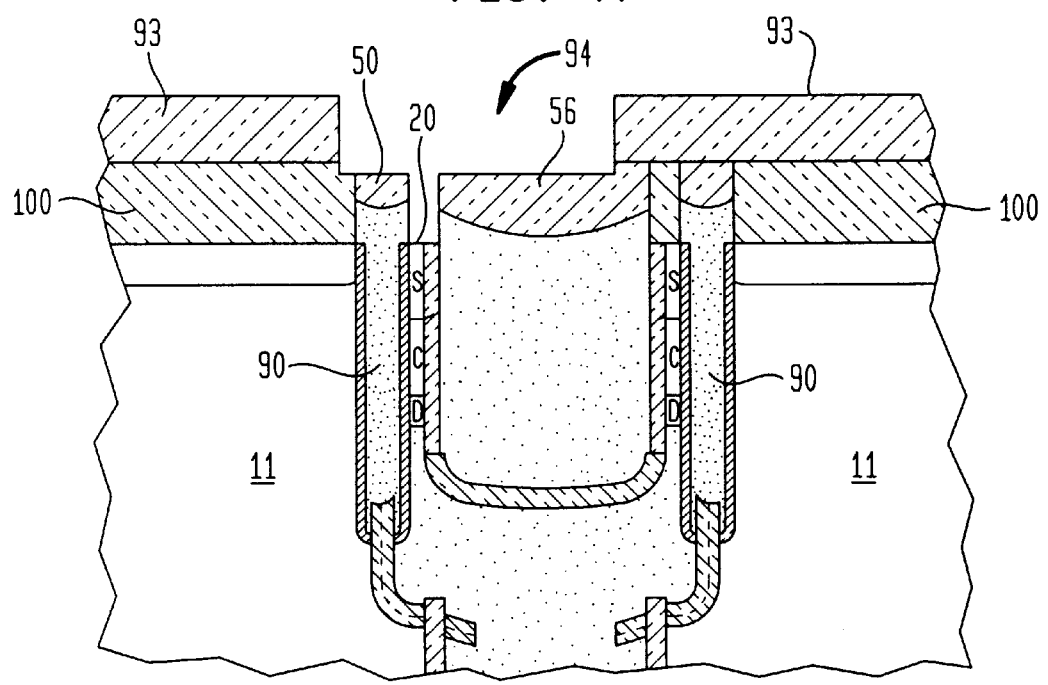
Figure 4U:
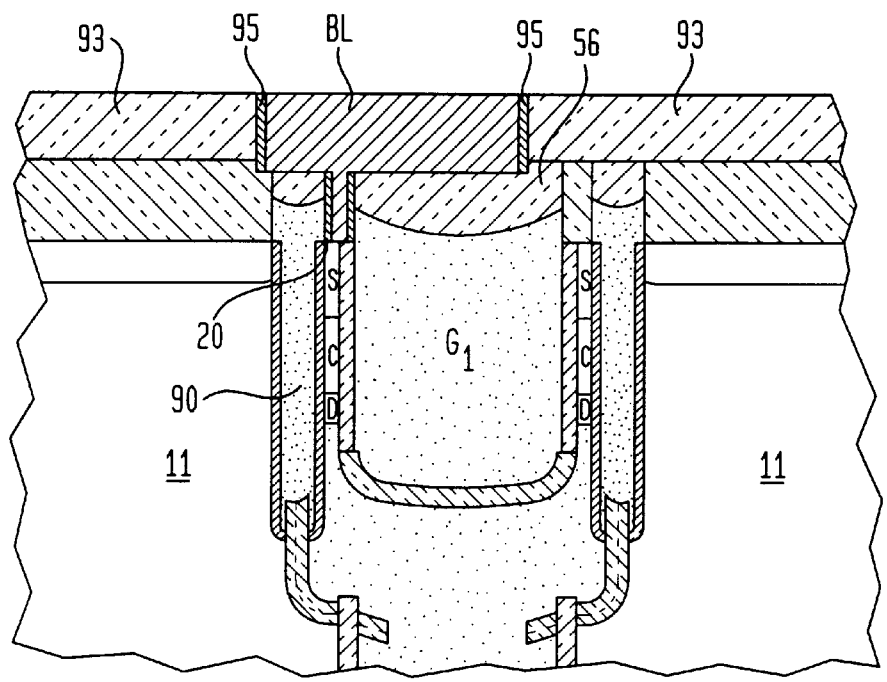
Figure 4V:
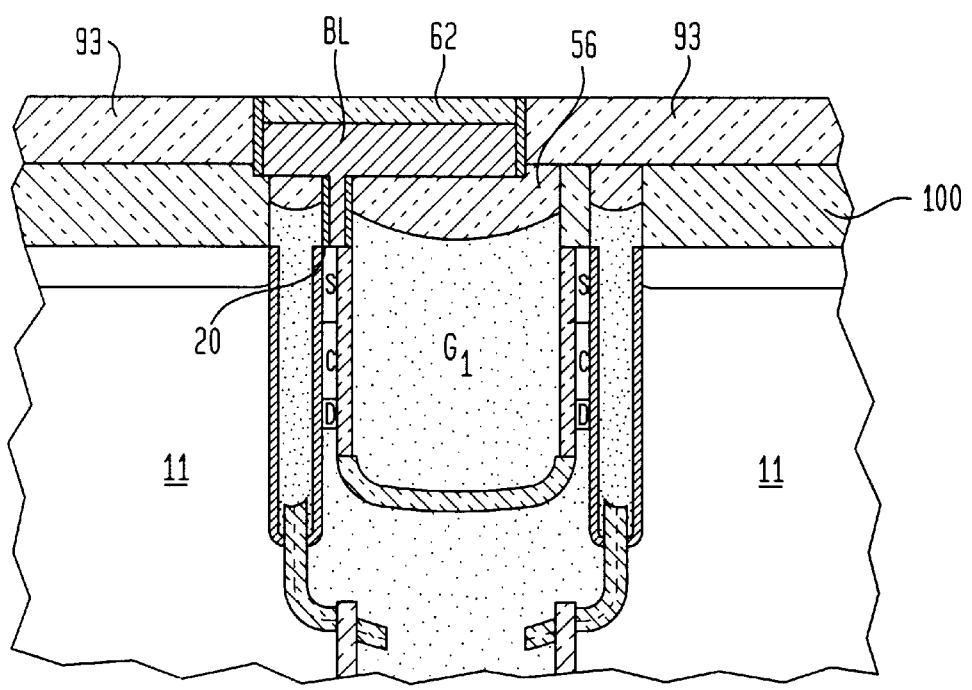

Referring now to FIGS. 4A through 4V, the process for producing the DRAM cell 12a will be described. Referring to FIG. 4A, the silicon substrate 11, here n type silicon, is provided with a dielectric layer 100, here a composite layer having a thin silicon dioxide layer and a thicker silicon nitride layer disposed on the silicon dioxide layer. A trench is formed in the upper portion of the silicon substrate 11 using photolithograpy. The dielectric layer 44 is formed on the sidewalls of the trench. The dielectric layer 44 provides a lower portion of the node dielectric for the capacitor CAP, FIG. 3 and is here a layer of silicon oxynitride. The trench is then filled with a conductive material 31, here for example, n$^+$ doped polycrystalline silicon, to provide the bottom portion of the storage node 30 (FIG. 3) of the capacitor CAP.

Referring to FIG. 4B, the upper portion of the doped polycrystalline silicon 31 is recessed thereby exposing upper portions of the silicon oxynitride layer 44. A layer of silicon dioxide is deposited over the structure and then exposed to a reactive ion etch (RIE) to thereby remove all but portions of the deposited silicon dioxide except for the portion on the upper exposed portions of layer 44 thereby forming a layer 41 of silicon dioxide on the upper portions of layer 44, as shown in FIG. 4B.

Referring now to FIG. 4C, the structure shown in FIG. 4B is exposed to a silicon etch to thereby further recess the doped polycrystalline silicon 31 and thereby expose intermediate portions of the silicon oxynitride layer 44. The exposed portions of the silicon oxynitride layer 44 are removed using a wet etch (e.g., for example, 25:1 dilute hydrofluoric acid for 40 seconds for the oxide and hot phosphoric acid to remove the nitride) to thereby expose underlying portions 45 of the silicon sidewalls of the trench 47 which was, as described above in connection with FIG. 4A, photolithographically formed in the silicon substrate 11. The resulting structure is shown in FIG. 4C.

Referring now to FIG. 4D, the structure shown in FIG. 4C is isotopically etch back the exposed portion 45 of the silicon substrate 11 to form silicon surface portions 45' in such substrate 11. The structure is exposed to thermal oxidation process thereby oxidizing the exposed portions of the silicon 45' and surface portions of the polycrystalline silicon 31 to form the silicon dioxide layer 42 (FIG. 1), as shown in FIG. 4E. Referring to FIG. 4F, the structure shown in FIG. 4E is subjected to a RIE process to remove portions of the silicon dioxide layer 42 which were grown on the more central regions 43 of the doped polycrystalline silicon 31. Thus, the central regions 43 of the polycrystalline silicon 31 are exposed, as shown in FIG. 4F.

Referring now to FIG. 4G, the trench 47, FIG. 4F, is refiled with n$^+$ doped polycrystalline silicon 33, as shown after planarization. It is noted that the deposited polycrystalline silicon 33 is deposited on the exposed portions 43 (FIG. 4F) of the previously deposited doped polycrystalline silicon 31. Further, both depositions have the same type dopant thereby electrically connecting both deposited polycrystalline silicon materials 31, 33.

The deposited polycrystalline silicon 33 is recessed using a Reactive Ion Etch (RIE) (e.g., $SF_6$ and $CH_4$) to thereby form the structure shown in FIG. 4H. It is noted that the recessing of the doped polycrystalline silicon 33 exposes upper portions 47 of the thermally grown silicon dioxide layer 42. These exposed portions 47 of the silicon dioxide layer 42 are selectively removed using a wet etch to selectively remove exposed oxide layers (e.g., dilute $HF_3$), to expose portions 51 of the silicon substrate 11, as shown in FIG. 4I. Thus, in addition to etching away the exposed portions 47 (FIG. 4H) of the thermally grown silicon dioxide layer 42, the exposed silicon dioxide layer 41 is also remove to thereby form the structure shown in FIG. 4I.

Referring now to FIG. 4J, the trench 47, FIG. 4I, is refiled with n$^+$ doped polycrystalline silicon 35, as shown after planarization. It is noted that the deposited polycrystalline silicon 35 is deposed on, and hence is electrically connected to, the exposed portions 49 (FIG. 4I) of the previously deposited doped polycrystalline silicon 33 (FIG. 4I) and on the exposed portions 51 of the silicon substrate 11. Thus, the doped polycrystalline silicon 31, 33, and 35, here all n$^+$ type silicon, together provide the storage node 30 (FIG. 3).

Referring now to FIG. 4K, the upper portion of the doped polycrystalline silicon 35 is recessed using an isotropic etch to produce the structure shown. It is noted that the etch exposes upper portions 53 of the polycrystalline silicon 35.

Referring to FIG. 4L, the structure shown in FIG, 4K is subjection to a thermal process to oxidize the exposed portions 53 (FIG. 4K) of the doped polycrystalline silicon 35 and convert such portion into the thermally grown, silicon dioxide layer 40 (FIG. 1), as shown. The exposed portions of the silicon oxynitride layer 44 (FIG. 4K) are etched away using a wet etch, (e.g., for example, 25:1 dilute hydrofluoric acid for 40 seconds for the oxide and hot phosphoric acid to remove the nitride) thereby exposing the upper silicon substrate 11 portions of trench 47. The structure is then heated to form the thermally grown silicon dioxide layer 26 (FIG. 1) by thermal oxidation of the exposed portions of the silicon substrate 11. This thermally grown silicon dioxide layer 26 provides the gate oxide for the gate $G_1$ (FIG. 3). As noted above, the thickness of the layer 26 may be accurately controlled by the thermal growth process.

Referring now to FIG. 4M, a layer of doped n$^+$ doped polycrystalline silicon 70 (which provides the gate $G_1$, FIG. 3) is deposited over the structure and then recessed to a level above the bottom surface of dielectric layer 100 (FIG. 4L). The recess is then filed with the silicon dioxide 56 (FIG. 3). The silicon nitride portion of the dielectric layer 100 is then striped using hot phosphoric acid. The resulting structure is shown in FIG. 4M, with the thinner, silicon dioxide portion of the dielectric layer 100 (FIG. 4L), not shown.

Referring now to FIG. 4N, the layer 66 of silicon nitride is deposited over the surface of the structure. The layer 66 is deposited uniformly, as shown, having a predetermined thickness. As will be described, this thickness of the silicon nitride layer 66 is used to establish the width of the active areas whether the source gate channel and drain regions of provided in the substrate 11.

Referring now to FIG. 4O, an anisotropic etch here a Reactive Ion Etch (RIE) is used to provide proper, well controlled thickness of the silicon nitride spacer from layer 66 because such thickness, as will be described, in effect defines the thickness of the active region of the transistor.

Referring to FIG. 4P, a layer 72 of polycrystalline silicon is deposited over the structure and photolithographically patterned to provide a sacrificial polycrystalline silicon spacer. Next, a layer 76 of silicon dioxide is deposited over the structure and planarized to provide a surface fill, as shown in FIG. 4Q. Next, boron is implanted in selected regions of the substrate 11 and processed to form p type conductivity regions 73, as shown.

Referring now to FIG. 4R, the structure shown in FIG. 4O is exposed to an anisotropic etch, (e.g., RIE etch, $SF_6$ and $CH_4$), which selectively removes silicon. Thus, the exposed sacrificial polycrystalline silicon 70 is etched away thereby exposing underlying portions of the silicon substrate 11. These exposed portions of the silicon substrate 11 are removed forming a cylindrical-shaped trench 78 as shown in FIG. 4R. It is noted that outer sidewalls of the cylindrical-shaped trench 78 are provided by the silicon substrate 11, upper inner portions 80 of the cylindrical-shaped trench 78 are also provided by the silicon substrate 11, and lower inner portions of the cylindrical-shaped trench 78 are provided by the polycrystalline silicon 33, 35, as indicated. These inner portions 80 of the n type conductivity silicon substrate 11 will provide the active region of the transistor T (FIG. 3), as will be described. It should be noted that the thickness of the active region 80 is equal to the thickness of the vertically extending silicon nitride 66 minus the thickness of the thermally grown silicon dioxide layer 26. As noted above, the thickness of the silicon dioxide layer 26 is well controlled by the thermal growth process. Thus, the thickness of the active area 80 is, in effect, defined by the thickness of the silicon nitride spacer 66, rather than by lithography.

The structure shown in FIG. 4R is heated to thermally oxidize the exposed portions of the silicon substrate and thereby form thermally grown silicon dioxide which provides the gate oxide layer 28 for gate $G_2$ (FIG. 3) and thermally grown silicon dioxide layer 46 which provides the outer periphery of the cell 12a (FIGS. 1 and 3), as shown in FIG. 4R. As noted above, the region 80 between the pair of thermally grown gate oxide layers 26, 28 provides a cylindrical-shaped active region for the transistor T (FIG. 3). It is noted that the thickness of the thermally grown silicon dioxide layer 46 is well controlled by the thermal growth process.

Referring now to FIG. 4S, the cylindrical-shaped trench 78 shown in FIG. 4R is filled with $n^+$ doped polycrystalline silicon 90 and then etched-back, as indicated. The region above the etched back polycrystalline silicon 90 is filled with silicon dioxide 92 thereby producing the structure shown in FIG. 4S. Next, the n type conductivity doped drain region, D, is formed by ion implantation in the lower portion of the active area 80 of the silicon substrate 11. The p conductivity doped channel region, C, is then formed by ion implantation in the middle portion of the active area 80 of the silicon substrate 11 at a lower energy level that used to form the drain region, D. The $n^+$ conductivity doped source region is then formed by ion implantation in the upper portion of active area 80 of the silicon substrate 11 using an energy level less than that used for the channel region C implantation. It is noted that the source, channel, and drain regions S, C, and D, are cylindrical-shaped and are vertically stacked contiguous one another, as shown in the active region 80 provided in the substrate 11. It is noted that the silicon nitride stub 66 may be removed prior to the implantation.

Referring now to FIG. 4T, a layer 93 of silicon dioxide is deposited over the surface of the structure shown in FIG. 4S and is then patterned lithographically to have a window 94 formed therein using a bit line mask. The exposed portion of the silicon nitride stub 66 over a portion of the trench 78 (FIGS. 4R and 4S) is etched using hot phosphoric acid to thereby expose the source contact region 20 (FIGS. 3 and 4T) of the cell 12a transistor T, as shown in FIG. 4T.

Referring now to FIG. 4U, a layer 95 of silicon dioxide is deposited over the surface of the structure shown in FIG. 4T are then such structure is subjected to reactive ion etch to thereby form silicon dioxide spacers, as indicated. These spacers isolate the bit line BL making electrical contact at contact region 20 from the gate polycrystalline silicon 90 and the gate $G_1$. Next, using a TiN liner, not shown. a metal film, for example, tungsten, aluminum, or copper, is filed into the window 94 (FIG. 4T). The film is etched, as shown in FIG. 4V to provide the bit line BL. Next, the etched-back film forming the bit line BL is filled with silicon nitride 62, to form the structure shown in FIG. 4V. This thereby forms the bit lines BL with a contact at region 20 to each cell 12.

Figure 4W:
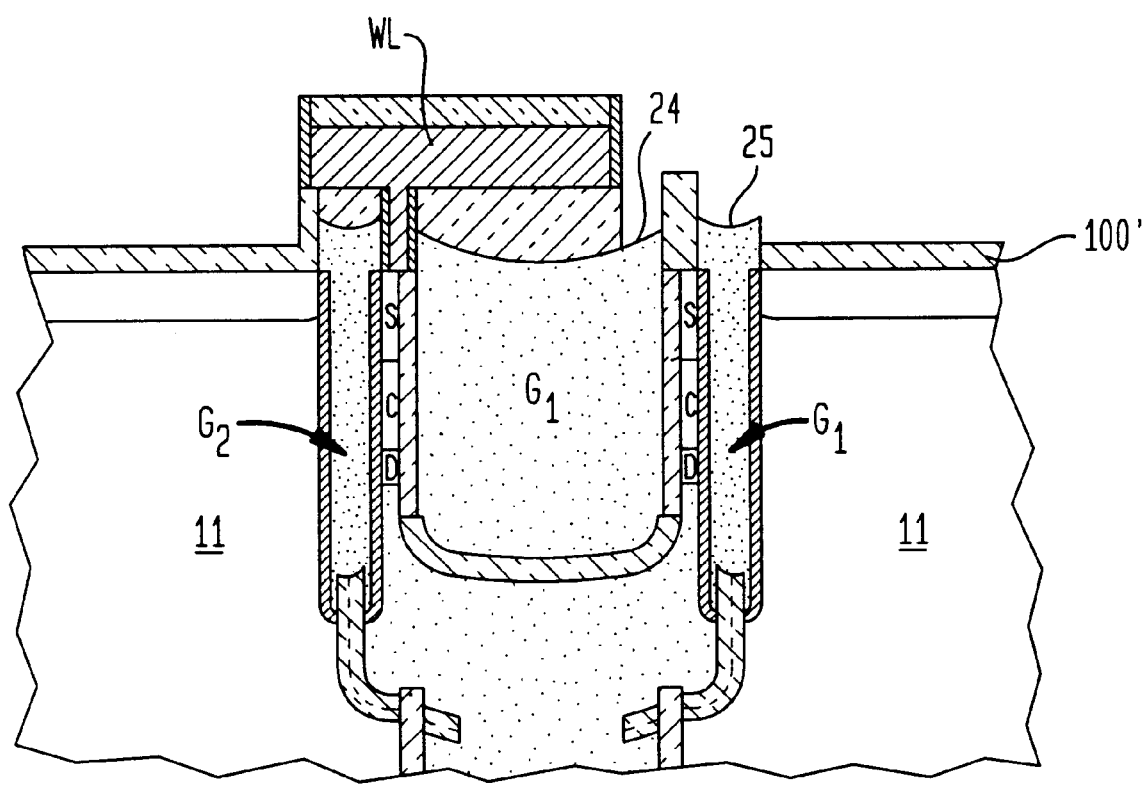

Next, a silicon dioxide layer, not shown, is deposited over the structure. Using a word line mask, the silicon dioxide is etched down to expose the gate $G_1$, $G_2$ contact regions 24, 25, respectively (FIGS. 3 and 4W), and leaving the lower portion 100' of the dielectric layer 100 (i.e., a thin layer of thermally grown silicon dioxide with an upper layer of silicon nitride).

Referring to FIG. 3, the silicon dioxide spacers 64 are formed to isolate bit lines BL from word lines WL. A metal film, for example tungsten, copper or aluminum, are filled into the oxide openings, on top of a film, not shown, of TiN, to thereby form the word line BL in contact with each cell at contact regions 24, 25 thereby electrically the bit line BL to the gates $G_1$ and $G_2$.

Other embodiments are within the spirit and scope of the appended claims. For example, many process steps could be carried out using alternative materials and/or alternative processing conditions. For example, the node dielectric materials with higher dielectric constant such as $Ta_2O_5$ could be used. Also, conductive materials other than polycrystalline silicon could be used to fill the trench. Alternative routes exist to build the peripheral transistors outside the cell array. They could be of similar double-gate, vertical design as in the cell itself and therefore build during the processing steps building the array cell. Or, they could be of conventional single-gate, stack-on-top-of-the-silicon design and be built after completion of the array processing.

What is claimed is:

1. A DRAM cell disposed in an electrically isolated region of a semiconductor body, comprising:

a storage capacitor disposed in a trench, such capacitor being disposed entirely within the isolated region of the semiconductor body;

a transistor disposed in the isolated region, such transistor having a pair of gates for controlling a flow of carriers through a channel region between a source region and a drain region of the transistor, such channel region being disposed vertically beneath a surface of the body;

a word line for addressing the cell, such word line having an electrical contact region to the pair of gates of the transistor, such contact region being disposed entirely within the isolated region of the semiconductor body;

wherein the transistor has an active area, such active area having the source and drain regions, and channel region, such active area being disposed entirely within the isolated region of the semiconductor body; and including a bit line for the cell, such bit line being in electrical contact with the transistor at a pair of bit line contact regions, both such bit line contact regions being disposed entirely within the isolated region of the cell.

2. A memory cell, comprising:

(a) a storage capacitor disposed in a trench formed in a semiconductor body;

(b) a transistor electrically connected to the capacitor, such transistor comprising:

(i) a gate channel region disposed between a source region and a drain region, such regions being disposed in the body and extending vertically beneath a surface of the body;

(ii) a pair of dielectric layers, each one thereof being disposed on a corresponding one of a pair of opposing surface portions of the gate channel region;

(iii) a pair of gate electrodes, each one thereof being disposed on a corresponding one of the pair of dielectric layers.

3. A memory cell, comprising:

(b) a storage capacitor disposed in a trench formed in a semiconductor body;

(c) a transistor electrically connected to the capacitor, such transistor comprising:

(i) a gate channel region disposed between a source region and a drain region, such gate channel region being disposed in the body and extending vertically beneath a surface of the body;

(ii) a pair of dielectric layers, each one thereof being disposed on a corresponding one of a pair of opposing surface portions of the gate channel region;

(iii) a pair of gate electrodes, each one thereof being disposed on a corresponding one of the pair of dielectric layers.

4. A memory cell disposed within an electrically isolated region of a semiconductor body, such cell comprising:

(a) a storage capacitor disposed in a trench formed in a semiconductor body, such capacitor being disposed entirely within the isolated region of the semiconductor body;

(b) a transistor electrically connected to the capacitor, such transistor comprising:

(i) a gate channel region disposed between a source region and a drain region, such gate channel region being disposed in the body and extending vertically beneath a surface of the body;

(ii) a pair of dielectric layers, each one thereof being disposed on a corresponding one of a pair of opposing surface portions of the gate channel region;

(iii) a pair of gate electrodes, each one thereof being disposed on a corresponding one of the pair of dielectric layers.

(c) a word line for addressing the cell, such word line having an electrical contact region to the pair of gate electrodes, such contact region being disposed entirely within the isolated region of the semiconductor body.

5. The cell recited in claim 4 wherein the transistor has an active area, such active area having the source and drain regions, and a channel region, such active area being disposed entirely within the isolated region of the semiconductor body.

6. The cell recited in claim 5 including a bit line for the cell, such bit line being in electrical contact with the transistor at a pair of bit line contact regions, both such bit line contact regions being disposed entirely within the isolated region of the cell.

* * * * *